United States Patent
Orimoto et al.

(10) Patent No.: US 7,495,282 B2
(45) Date of Patent: Feb. 24, 2009

(54) NAND MEMORY WITH VIRTUAL CHANNEL

(75) Inventors: Takashi Orimoto, Sunnyvale, CA (US);
James Kai, Santa Clara, CA (US);
Henry Chien, San Jose, CA (US);
George Matamis, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 111 days.

(21) Appl. No.: 11/626,778

(22) Filed: Jan. 24, 2007

(65) Prior Publication Data

US 2008/0170438 A1    Jul. 17, 2008

Related U.S. Application Data

(60) Provisional application No. 60/884,863, filed on Jan. 12, 2007.

(51) Int. Cl.
*H01L 21/336* (2006.01)
(52) U.S. Cl. ............... 257/315; 257/316; 257/E27.103; 257/E29.129
(58) Field of Classification Search ............... None
See application file for complete search history.

(56) References Cited

U.S. PATENT DOCUMENTS

| 5,677,556 | A | 10/1997 | Endoh |
| 5,923,976 | A | 7/1999 | Kim |
| 6,888,755 | B2 * | 5/2005 | Harari ............ 365/185.02 |
| 6,905,926 | B2 | 6/2005 | Lojek |
| 2002/0014645 | A1 | 2/2002 | Kobayashi |
| 2004/0079988 | A1 | 4/2004 | Harari |
| 2004/0150032 | A1 * | 8/2004 | Wu ........................ 257/315 |
| 2004/0164340 | A1 | 8/2004 | Arai |
| 2005/0079662 | A1 | 4/2005 | Miki |
| 2005/0184327 | A1 | 8/2005 | Ozawa |
| 2005/0199939 | A1 * | 9/2005 | Lutze et al. ............. 257/315 |
| 2006/0138478 | A1 | 6/2006 | Buh |
| 2006/0194388 | A1 | 8/2006 | Hashimoto |
| 2006/0211205 | A1 | 9/2006 | Jeon |
| 2006/0267067 | A1 | 11/2006 | Ishihara |

OTHER PUBLICATIONS

Schmidt et al. "Inversion Layer Mobility of MOSFET's with Nitrided Oxide gate dielectrics", IEEE Transactions on Electron Devices, vol. 35, No. 10 Cot. 1998, pp. 1627-1631.*
U.S. Appl. No. 11/626,784, filed Jan. 24, 2007.
Office Action dated Jan. 22, 2008, U.S. Appl. No. 11/626,784, filed Jan. 24, 2007.
International Search Report and Written Opinion dated May 28, 2008 in PCT Application No. PCT/US2007/088145.

(Continued)

*Primary Examiner*—W. David Coleman
*Assistant Examiner*—Shaka Scarlett
(74) *Attorney, Agent, or Firm*—Vierra Magen Marcus & DeNiro LLP

(57) ABSTRACT

A string of nonvolatile memory cells are connected together by source/drain regions that include an inversion layer created by fixed charge in an overlying layer. Control gates extend between floating gates so that two control gates couple to a floating gate. A fixed charge layer may be formed by plasma nitridation.

12 Claims, 5 Drawing Sheets

OTHER PUBLICATIONS

Schmidt et al. Inversion Layer Mobility of MOSFET's with Nitrided Oxide gate dielectrics, IEEE Transactions on Electron Devices, vol. 35, No. 10 Cot. 1998, pp. 11627-11631.

Chen et al. "Thermally-Enhanced remote Plasma Nitrided Ultrathin (1.65 nm) Gate Oxide with Excellent Performances in Reduction of Leakage Current and Boron Diffusion" IEEE Electron Device Letters, vol. 22, No. 8, Aug. 2001.

Office Action dated Jul. 23, 2008 in U.S. Appl. No. 11/626,784.

Response to Office Action dated Sep. 8, 2008 in U.S. Appl. No. 11/626,784.

Notice of Allowance and Fee(s) Due dated Oct. 22, 2008 in U.S. Appl. No. 11/626,784.

* cited by examiner

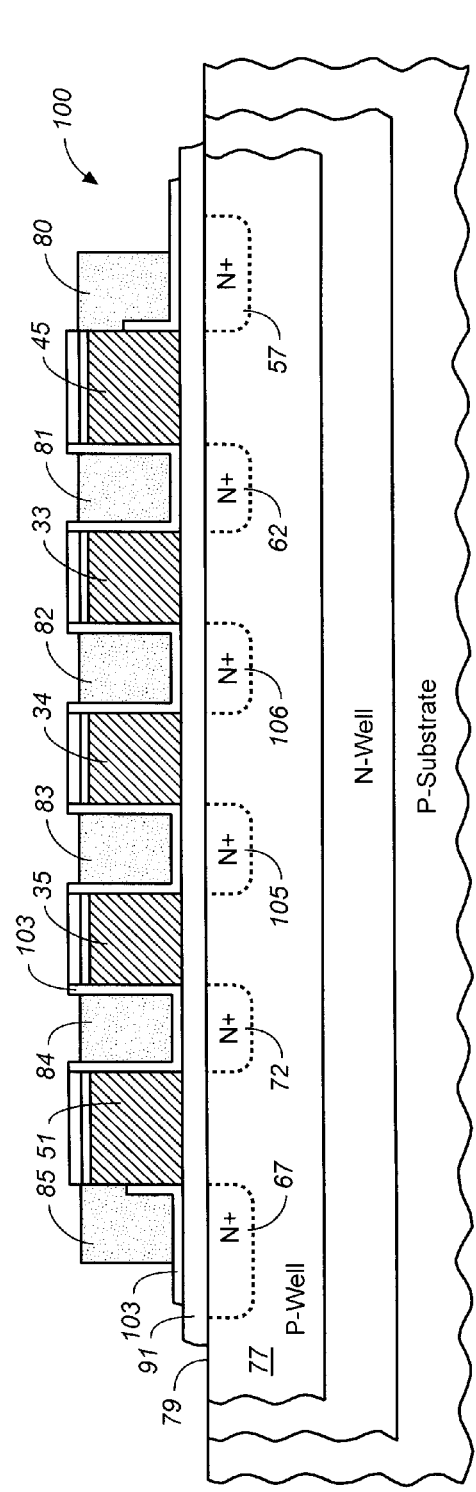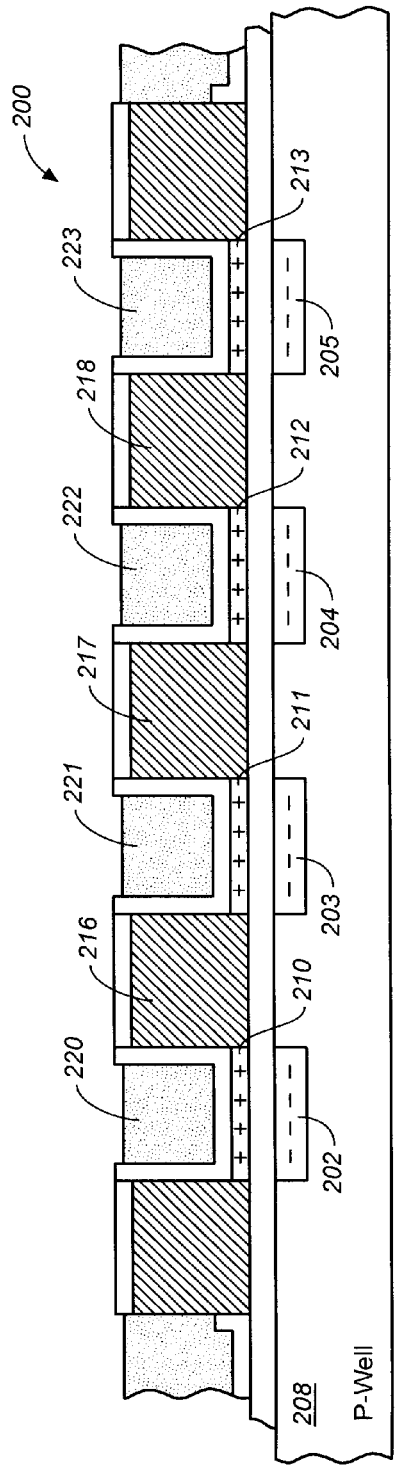

NAND MEMORY WITH VIRTUAL CHANNEL

CROSS-REFERENCE TO RELATED APPLICATIONS

This application claims the benefit of U.S. provisional patent application No. 60/884,863, filed on Jan. 12, 2007. This application is related to U.S. patent application Ser. No. 11/626,784, filed Jan. 24, 2007, entitled, "Methods of Forming NAND Memory with Virtual Channel"; These applications are incorporated in their entirety by reference as if fully set forth herein.

BACKGROUND OF THE INVENTION

This invention relates to nonvolatile memories and methods of forming nonvolatile memories. In particular, this application relates to nonvolatile memory arrays in which a series of floating gate memory cells are electrically connected in series.

Nonvolatile memory systems are used in various applications. Some nonvolatile memory systems are embedded in a larger system such as a personal computer. Other nonvolatile memory systems are removably connected to a host system and may be interchanged between different host systems. Examples of such removable memory systems include memory cards and USB flash drives. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards. There are several USB flash drive products commercially available from SanDisk Corporation under its trademark "Cruzer®." USB flash drives are typically larger and shaped differently than the memory cards described above.

Different types of memory array architecture are used in nonvolatile memory systems. In one type of architecture, a NAND array, a series of strings of more than two memory cells, such as 16 or 32, are connected along with one or more select transistors between individual bit lines and a reference potential to form columns of cells. Word lines extend across cells within a large number of these columns. An individual cell within a column is read and verified during programming by causing the remaining cells in the string to be over driven so that the current flowing through a string is dependent upon the level of charge stored in the addressed cell.

SUMMARY OF THE INVENTION

A nonvolatile memory array according to an embodiment of the present invention comprises: a plurality of floating gate memory cells connected in series, the plurality of floating gate memory cells electrically connected by source/drain regions, a source/drain region including an inversion layer created by a fixed charge within a fixed charge layer portion that extends over the source/drain region, control gates extending between floating gates such that a control gate overlies the fixed charge layer portion.

An nonvolatile memory array according to another embodiment comprises: a plurality of memory cells connected in series to form a NAND string, each of the plurality of memory cells having a floating gate; a plurality of control gates, each of the plurality of control gates extending between adjacent floating gates; a plurality of source/drain regions that electrically connect the plurality of memory cells in series, each of the plurality of source/drain regions underlying one of the plurality of control gates; and a plurality of fixed charge layer portions, each of the plurality of fixed charge layer portions extending over one of the plurality of source/drain regions, each of the plurality of fixed charge layer portions holding a fixed electrical charge.

A method of forming a nonvolatile memory array according to an embodiment of the present invention comprises: forming a plurality of floating gates overlying a substrate surface; forming a plurality of fixed charge layer portions overlying the substrate surface, the plurality of fixed charge layer portions interspersed between the plurality of floating gates, each of the plurality of fixed charge layer portions formed having fixed electrical charge; and forming a plurality of control gates overlying the plurality of fixed charge layer portions.

A method of forming a nonvolatile memory array according to another embodiment comprises: forming a gate dielectric layer over a substrate surface; subsequently forming a plurality of floating gates overlying the gate dielectric layer; subsequently forming a plurality of fixed charge layer portions, individual fixed charge layer portions overlying the substrate surface between floating gates; forming an interlayer dielectric layer over the plurality of floating gates; and forming a plurality of control gates between floating gates.

BRIEF DESCRIPTION OF THE DRAWINGS

FIG. 1 shows a cross section of a NAND string having control gates located between floating gates so that two control gates couple to an individual floating gate.

FIG. 2 shows a cross section of a NAND string according to an embodiment of the present invention where source/drain regions include an inversion layer produced by a fixed charge in an overlying fixed charge layer.

DETAILED DESCRIPTION OF ILLUSTRATED EMBODIMENTS

Figure 3:
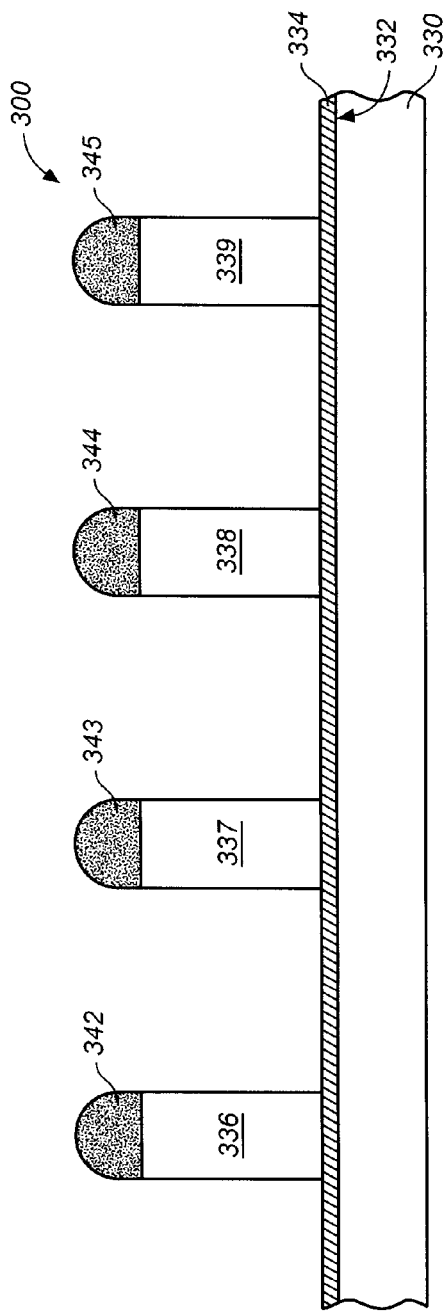
FIG. 3 shows a cross section of a NAND string according to an embodiment of the present invention at an intermediate stage of fabrication where floating gates are separated from a substrate by a tunnel oxide layer.

FIG. 1 shows a cross section of a NAND flash memory string 100 that has control gates 81-84 extending on both sides of floating gates 33-35 (this type of array is sometimes referred to as ENAND). Examples of such strings and methods of forming them are described in U.S. Pat. No. 6,888,755. In string 100 of FIG. 1 a floating gate is coupled to two control gates, one on either side of the control gate (e.g. floating gate 34 is coupled to control gates 82 and 83). This is in contrast to a common memory design where a control gate overlies a floating gate so that each floating gate is coupled to only one control gate. A memory string such as that of FIG. 1 may be formed as part of a memory array having many strings. Neighboring strings may be isolated from each other by Shallow Trench Isolation (STI) structures, or other means (not shown in FIG. 1). In some cases, individual stings may have 8, 16, 32 or more memory cells connected together in series. Select gates 45, 51 are provided at either end of string 100 and are connected to select lines 80, 85 to allow string 100 to be connected to circuits used for accessing the memory cells of string 100. Floating gates 33-35 are separated from substrate 77 by a gate dielectric (tunnel oxide) layer 91 overlying substrate surface 79.

In string 100 of FIG. 1, source/drain regions 57, 62, 67, 72, 105, 106 are provided in substrate 77 on either side of floating gates. Source/drain regions 57, 62, 67, 72, 105, 106 are shared by neighboring memory cells and provide an electrically conductive pathway between memory cells so that the memory cells in string 100 may be connected in series. Source/drain regions 57, 62, 67, 72, 105, 106 of FIG. 1 are formed by implantation using floating gates 33-35 and select gates 45, 51 to provide a mask so that source/drain regions 57, 62, 67, 72, 105, 106 are self-aligned to floating gates 33-35 and select gates 45, 51. Control gates 81-84 are then formed by depositing a conductive layer (e.g. doped polysilicon) and removing the conductive material where it overlies floating gates 33-35 and select gates 45, 51 so that conductive material remains between floating gates 33-35. Thus, control gates 81-84 may be considered to be self-aligned to floating gates 33-35. Control gates 81-84 are separated from floating gates 33-35 by an interlayer dielectric layer 103. Control gates 81-84 extend in the direction perpendicular to the cross section shown and control gates of neighboring strings are connected together as word lines. Thus, a word line is a conductive element that extends through multiple strings and forms control gates where it couples to floating gates of individual strings. A control gate may couple to the underlying substrate to form a transistor where it overlies a source/drain region. By biasing a control gate a source/drain region may be made more conductive or less conductive. Thus, the source/drain region in a memory of this type (having a control gate close to the substrate, not just overlying the floating gate) may be considered as the channel of a transistor that has the control gate as its gate. In some cases, control gate bias may be sufficient to create an inversion layer that acts as a conductive source/drain region without requiring a source/drain implant.

When an architecture such as that of FIG. 1 is scaled to small dimensions (e.g. gate length less than 45 nanometers) certain device characteristics may be negatively impacted. Problems encountered as a result of diminished channel length may be referred to as "short channel effects." Short channel effects may be caused by implanted dopant in a source/drain region reducing the effective gate length and causing variation in effective gate length. This problem may be mitigated by reducing the amount of dopant implanted. However, less dopant results in higher resistivity and thus higher source/drain resistance, which is generally undesirable. Reduction in post implant anneal thermal cycle may also help to mitigate the problem, but does not generally eliminate short channel effects.

FIG. 2 shows a cross section of a NAND string 200 according to an embodiment of the present invention in which source/drain regions 202-205 are not formed by implanting dopants, but by causing an inversion layer to be formed in substrate 208. An inversion layer is formed near a semiconductor surface when an electrical charge is in close proximity, the electrical charge drawing charge carriers to the surface where they form a conductive layer. Such an electrical charge may cause a flat band voltage shift and inverts the surface. A fixed interface charge may induce enough band bending to invert the surface to form a conduction channel. In FIG. 2, fixed charge layer portions 210-213 (having positive charge) are present on both sides of floating gates 216-218. Each of fixed charge layer portions 210-213 contains a fixed amount of positive electrical charge. The positively charged fixed charge layer portions 210-213 cause negatively charged electrons to be drawn to portions of substrate 208 underlying the fixed charge layer portions 210-213. There, the electrons form an inversion layer (source/drain regions 202-205) within the P-well (P-doped portion of substrate 208). An inversion layer formed in this manner will form a conduction channel between two floating gates. Since the conduction channel is formed without a metallurgical junction, the floating gate transistor will not experience short channel effects from the source/drain regions as may be experienced when dopants are implanted to form source/drain regions. As in FIG. 1, control gates 220-223 overlie source/drain regions 202-205 and source/drain regions 202-205 act as channels of transistors having control gates 220-223 as their gates. Unlike the example of FIG. 1, here such channels are not formed by dopant that is implanted in a substrate. Instead a channel is formed by charge carriers in an inversion layer caused by fixed charge. Such a channel may be referred to as a "virtual channel."

While the example of FIG. 2 shows positively charged fixed charge layer portions 210-213 (and hence negative charge in the inversion layer of source/drain regions 202-205), in other examples negatively-charged fixed charge layer portions may be provided causing positive charge carriers to form an inversion layer in an N-doped portion of a substrate.

While the example of FIG. 2 shows source/drain regions 202-205 being formed without source/drain implants, in other examples source/drain regions may be formed by a combination of implantation and an inversion layer. In this manner a lower implant dose may be used without resulting in an excessively high source/drain resistance. In general, the resistance of a source/drain region depends on any dopant in the region, any electrical field caused by fixed charge as described above and any electrical field caused by biasing an overlying control gate.

Fixed charge layers may be formed in a variety of ways using a variety of materials. Materials may include Hf-rich Hafnium oxide, Zr-rich Zirconium oxide, Silicon nitride, nitrided Silicon dioxide or some combination of these or other materials. Fixed charge layers may be formed by plasma deposition, plasma nitrification, plasma oxidation, chemical vapor deposition, atomic layer deposition, rapid thermal processing, ion implantation or other techniques. A fixed charge layer may contain charge as-deposited or may have charge added after deposition (such as by plasma processing). In some cases, a fixed charge layer has charge as-deposited and subsequently has additional charge added. In one example, nitridation of a Silicon dioxide surface results in a nidrided Silicon dioxide that contains positive charge. A fixed charge layer may result where surface states are created on a substrate by a process such as a plasma deposition process.

A fixed charge layer may be patterned in some manner so that fixed charge layer portions remain only where an inversion layer is to be formed. Alternatively, a fixed charge layer may be deposited as a blanket layer over a substrate having floating gates already formed. Where the fixed charge layer is on or close to the substrate surface (between floating gates) fixed charge layer portions cause inversion layer portions to be formed at these locations. Where such a fixed charge layer overlies a floating gate it has little effect and may be left in place. In this way, inversion layer portions are formed in the substrate in a manner that is self-aligned to the floating gates, since they are only formed where the fixed charge layer is in close proximity to the substrate surface. In some cases, a fixed charge layer may be deposited directly on a substrate surface, while in other cases a layer of Silicon dioxide or other material may lie between the substrate surface and the fixed charge layer.

FIGS. 3-8 show the formation of a NAND memory string 300 having control gates between floating gates and having a virtual channel according to an embodiment of the present invention. FIG. 3 shows a cross section of NAND string 300 at an intermediate stage in a fabrication process. A substrate 330 has a surface 332 covered by a dielectric layer 334 (in this case Silicon dioxide). Dielectric layer 334 may be formed by oxidation, chemical vapor deposition or in some other manner. Floating gates 336-339 are located on dielectric layer 334 so that dielectric layer 334 forms a gate dielectric (tunnel oxide) layer to allow electron tunneling from substrate 330 into the floating gates 336-339 under certain conditions. Gate dielectric layer 334 also extends across substrate surface 332 between floating gates 336-339. Floating gates 336-339 are covered by hardmask elements 342-345 (Silicon nitride in this example). Hardmask elements 342-345 are used to define floating gates 336-339 during an etch process. Hardmask elements 342-345 may be formed by lithographic patterning to have a width equal to the minimum feature size of the patterning process or may be formed using sidewall spacers or other techniques so that they have a width that is less than the minimum feature size of the lithographic process used. Short channel effects may be especially bad where such techniques are used to form floating gate memory cells with very short channels. To form a memory string such as that of FIG. 1, source/drain implants would generally be performed at this point. However, in this process an alternative technique is used. Exemplary processes that may be used to fabricate a memory array up to the point shown in FIG. 3 are described in U.S. Pat. No. 6,888,755.

Figure 4:
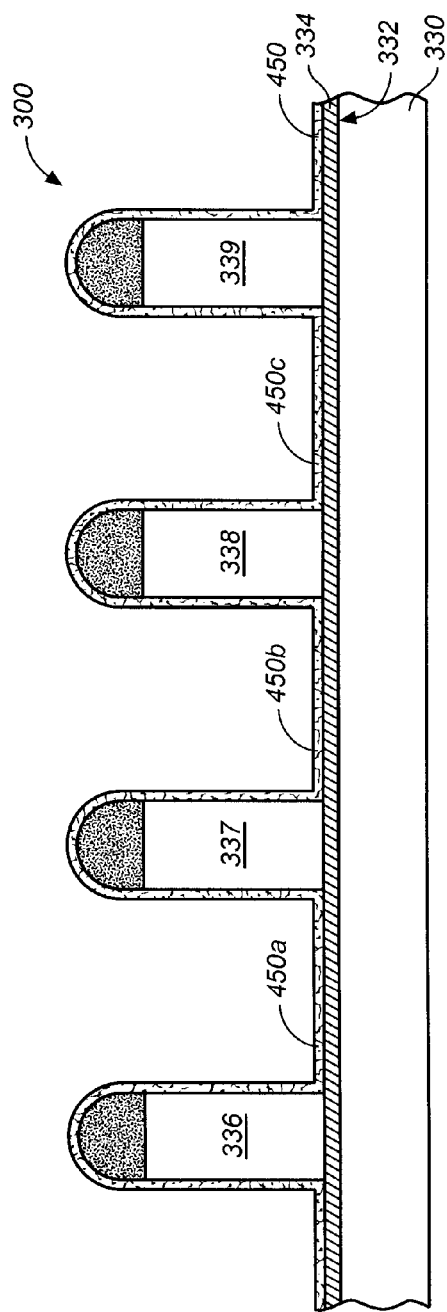
FIG. 4 shows the NAND string of FIG. 3 at a subsequent stage of fabrication after a nitridation process forms a fixed charge layer.

FIG. 4 shows NAND string 300 of FIG. 3 after a plasma nitridation process is performed. The plasma nitridation process results in nitridation of exposed surfaces of the dielectric layer 334 and floating gates 336-339. The plasma nitridation process may be performed using conventional plasma deposition equipment such as a Dual Plasma Nitride (DPN) chamber from Applied Materials, a Slot Plane Antenna (SPA) chamber from Tokyo Electron Limited (TEL), Modified Magnetron Typed (MMT) system from Hitachi Kokusai Electric or other plasma processing equipment. In one example a MMT system performs a nitridation process using the following conditions: Temperature=350 degrees Centigrade; Pressure=50 Pascals; Gas=Nitrogen (N2); RF Power=250 Watts. The result of the nitridation is that a nitrided layer 450 is formed. Portions 450a-c of nitrided layer 450 between floating gates 336-339 may include Silicon nitride and nitrided Silicon dioxide. Nitrided Silicon dioxide may also be formed over floating gates 336-339. Positively charged species are incorporated into nitrided surfaces. Generally, the charge incorporated into nitrided surfaces in this manner is not free to move because the nitrided surface is not electrically conductive, so the charge remains fixed in place. Thus, a nitrided surface formed in this way may be considered a fixed charge layer. Portions 450a-c of the fixed charge layer 450 that extend between floating gates 336-339 are on or close to substrate surface 332 (some Silicon dioxide of dielectric layer 334 may remain under fixed charge layer portions 450a-c, or all Silicon dioxide may be nitrided). The presence of electrical charge affects the portions of the substrate 330 underlying fixed charge layer portions 450a-c as discussed later. It may be desirable to locate fixed charge as close to the substrate as possible (without actually being in the substrate) and process conditions may be selected accordingly. This may provide a stronger channel inversion and hence a more conductive source/drain region.

Figure 5:
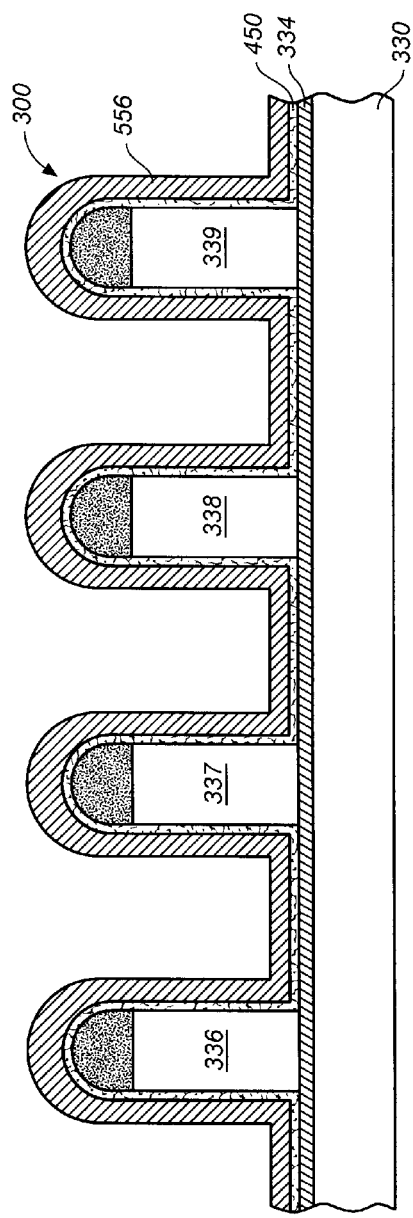
FIG. 5 shows the NAND string of FIG. 4 at a subsequent stage of fabrication after an interlayer dielectric (in this case an ONO stack) is deposited.

Subsequent to forming fixed charge layer 450, one or more dielectric materials are deposited over memory string 300 to form an interlayer dielectric layer 556 (a dielectric layer separating floating gates and control gates—also referred to as "interpoly dielectric" though materials other than polysilicon may be used for these layers in some cases). In the example of FIG. 5 the interlayer dielectric layer 556 is formed of three layers: a Silicon dioxide layer, then a Silicon nitride layer, then another Silicon dioxide layer forming an Oxide-Nitride-Oxide (ONO) stack. In other examples the interlayer dielectric may be formed of a single material or from a different combination of materials. An interlayer dielectric layer may be formed using a process that provides a low thermal cycle so that the fixed charge layer is not subject to high temperatures that might affect it. For example Atomic Layer Deposition (ALD), TEL SPA, or Applied Materials' In Situ Steam Generation (ISSG) system may be used.

Figure 6:
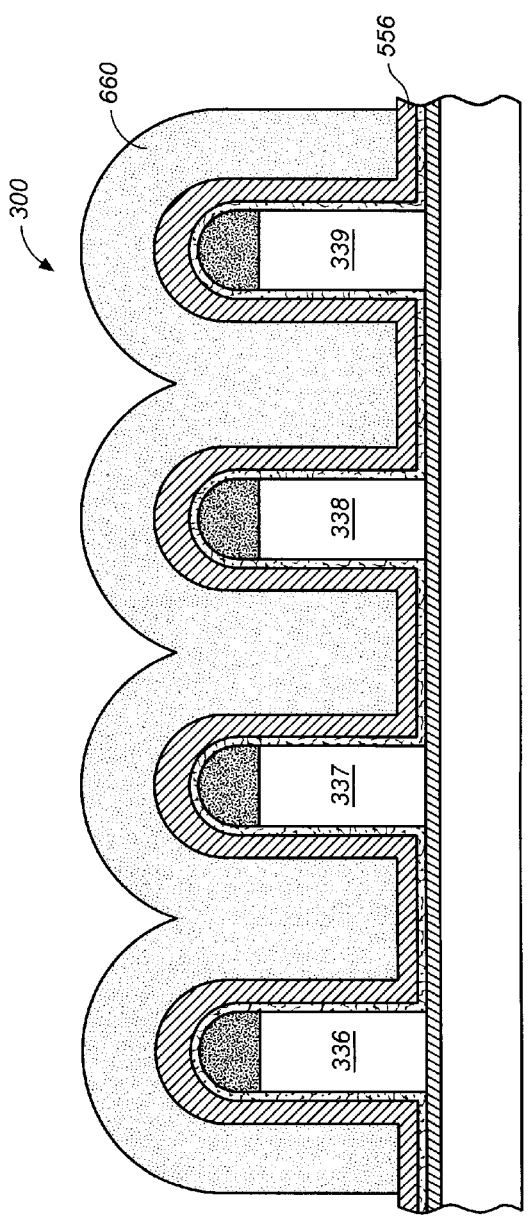
FIG. 6 shows the NAND string of FIG. 5 at a subsequent stage of fabrication after a conductive layer (in this case doped polysilicon) is deposited over the interlayer dielectric.

Subsequent to forming interlayer dielectric layer 556, a conductive material is deposited to form a conductive layer 660 as shown in FIG. 6. In the present example, conductive layer 660 is formed of doped polysilicon. Conductive layer 660 is deposited as a blanket layer that extends between floating gates 336-339 to fill the spaces between neighboring floating gates. Conductive layer 660 also extends over floating gates 336-339 when it is deposited, as shown in FIG. 6. Subsequently, portions of conductive layer 660 that overlie the floating gates 336-339 are removed.

Figure 7:
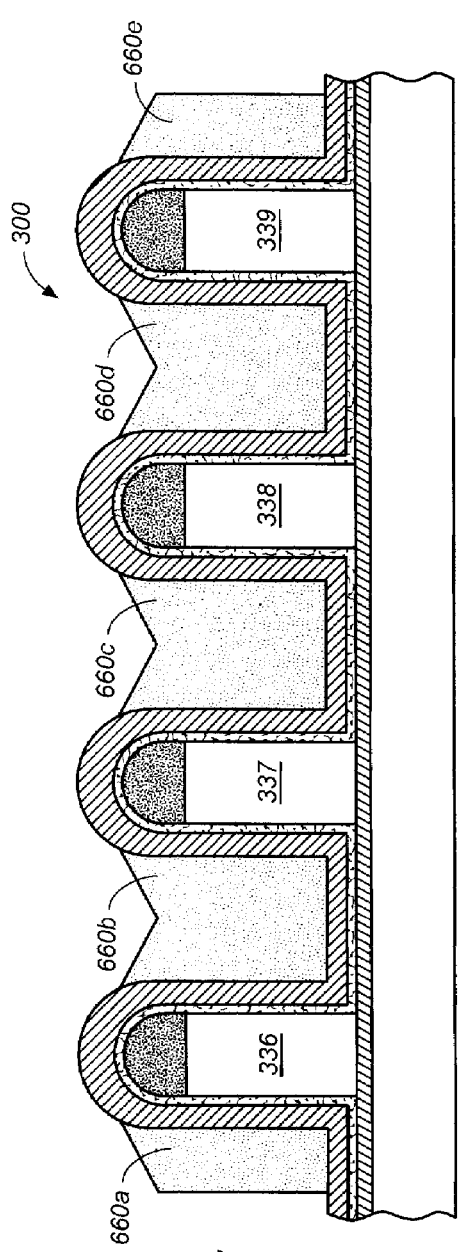
FIG. 7 shows the NAND string of FIG. 6 at a subsequent stage of fabrication after the conductive layer is etched back to remove excess conductive material, thus forming separate control gates between floating gates.

FIG. 7 shows string 300 after removal of excess conductive material to leave separate portions 660a-e of conductive material between floating gates 336-339. Conductive material may be removed by etch back, Chemical Mechanical Polishing (CMP) or other techniques. The resulting separate portions 660a-e of conductive material form control gates extending in a direction perpendicular to the cross section shown. Control gates of neighboring strings are connected together to form word lines that may serve many strings. A floating gate may be accessed through control gates on both sides, typically by using both control gates together.

Figure 8:
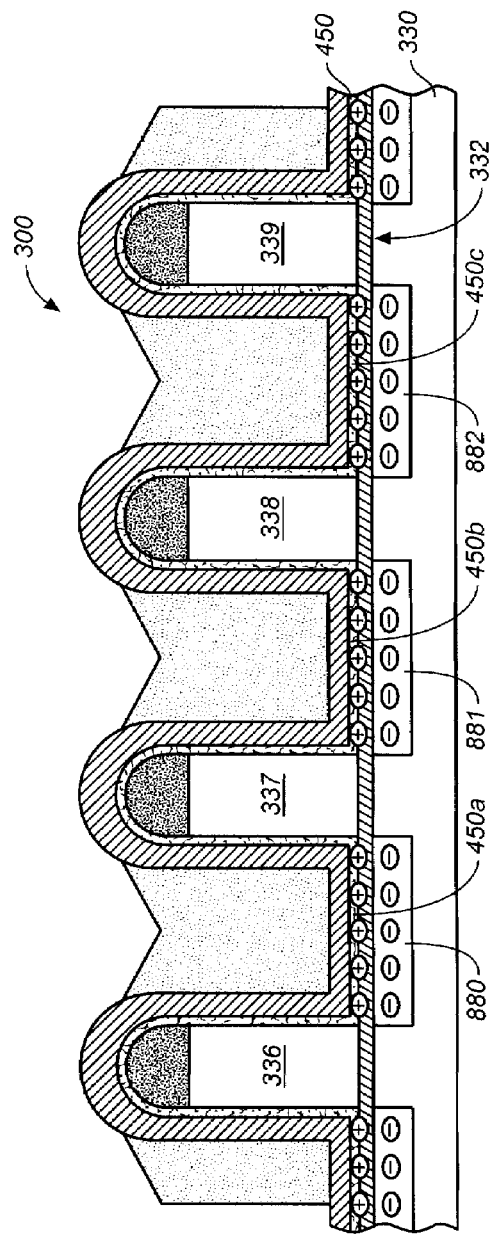
FIG. 8 shows the NAND string of FIG. 7 including the positive charge located in the fixed charge layer portions that lie between floating gates and the inversion layer portions formed under them.

FIG. 8 illustrates how string 300 of FIG. 7 operates as a string of memory cells connected in series. In particular, as previously discussed, fixed charge layer portions 450a-c are formed over substrate surface 332 between floating gates 336-339 and fixed charge layer portions 4520a-c cause inversion layer portions to be formed in underlying portions of substrate 330, these inversion layer portions forming source/drain regions 880-882. The memory cells thus formed are connected in series by the source/drain regions 880-882.

Figure 9:
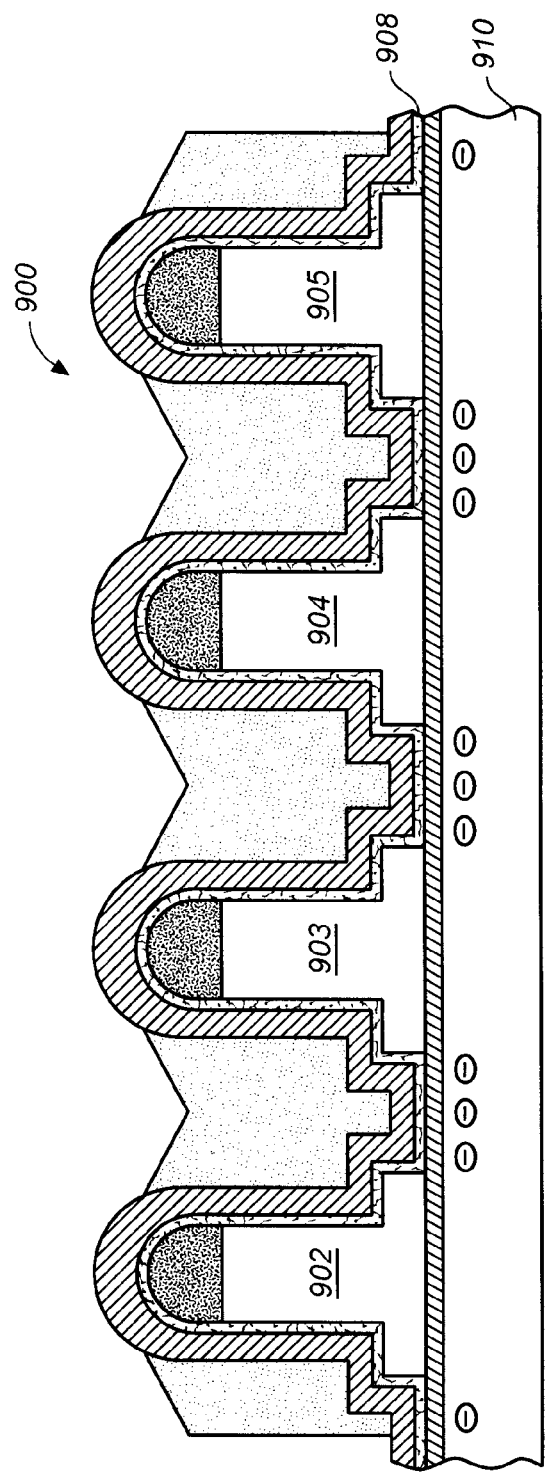
FIG. 9 shows a NAND string according to an alternative embodiment where floating gates have an inverted-T shape in cross section along the direction of the string and where source/drain regions include an inversion layer formed by charge in a fixed charge layer.

FIG. 9 shows a NAND string 900 according to an alternative embodiment of the present invention in which floating gates 902-905 have an inverted-T shape. Such inverted-T shaped floating gates may be formed by a process such as that described in U.S. Pat. No. 7,026,684. As with the previous example, subsequent to formation of floating gates 902-905, a fixed charge layer 908 is formed over string 900 so that fixed charge layer portions create inversion layer portions where the fixed charge layer is on or close to substrate 910 (i.e. between floating gates 902-905). A fixed charge layer may be used in this manner with floating gates of other shapes also. In some cases such a fixed charge layer eliminates the need for source/drain implants, while in other cases the fixed charge layer may be used in combination with source/drain implants.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain preferred embodiments, it is understood that the invention is entitled to protection within the full scope of the appended claims.

What is claimed is:

1. A nonvolatile memory array comprising:
a plurality of floating gate memory cells connected together in series, the plurality of floating gate memory cells electrically connected by source/drain regions, a source/drain region including an inversion layer that results from a fixed electrical charge within a fixed charge layer portion that extends over the source/drain region, a tunnel oxide underlying the plurality of floating gates, control gates extending between floating gates such that a control gate overlies the fixed charge layer portion.

2. The nonvolatile memory array of claim 1 wherein the fixed charge layer portion is a nitrided Silicon Dioxide.

3. The nonvolatile memory array of claim 1 wherein the plurality of floating gate memory cells is a NAND string.

4. The nonvolatile memory array of claim 1 wherein each of the plurality of floating gate memory cells has an inverted-T shape in cross section.

5. The nonvolatile memory array of claim 1 further comprising an interlayer dielectric layer extending between floating gates and control gates.

6. A nonvolatile memory array comprising:
a NAND string comprising a plurality of memory cells connected in series, each of the plurality of memory cells having a floating gate;
a plurality of control gates, each of the plurality of control gates extending between adjacent floating gates;
a plurality of source/drain regions that electrically connect the plurality of memory cells in series, each of the plurality of source/drain regions underlying one of the plurality of control gates; and
a plurality of fixed charge layer portions, each of the plurality of fixed charge layer portions extending over one of the plurality of source/drain regions, each of the plurality of fixed charge layer portions holding a fixed electrical charge, the source/drain regions result from the fixed charge layer portions.

7. The nonvolatile memory array of claim 6 further comprising select gates at either end of the NAND string.

8. The nonvolatile memory array of claim 6 wherein the fixed charge layer portions are nitrided Silicon Dioxide.

9. The nonvolatile memory array of claim 6 wherein each floating gate is coupled to two control gates.

10. A nonvolatile memory array comprising:
a plurality of floating gate memory cells connected together in series, the plurality of floating gate memory cells electrically connected by source/drain regions, a source/drain region results from a fixed electrical charge within a fixed charge layer portion that extends over the source/drain region, control gates extending between floating gates such that a control gate overlies the fixed charge layer portion.

11. The nonvolatile memory array of claim 10, wherein the fixed charge layer portion is a nitrided silicon dioxide.

12. The nonvolatile memory array of claim 10, wherein the plurality of floating gate memory cells is a NAND string.

* * * * *